(12) United States Patent
Gan et al.

(10) Patent No.: US 7,230,467 B1
(45) Date of Patent: Jun. 12, 2007

(54) CONSTANT EDGE GENERATION CIRCUITS AND METHODS AND SYSTEMS USING THE SAME

(75) Inventors: Jianhua Gan, Austin, TX (US); Jhonny Wong, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 42 days.

(21) Appl. No.: 11/089,145

(22) Filed: Mar. 24, 2005

(51) Int. Cl.
*H03H 11/26* (2006.01)

(52) U.S. Cl. ........................ 327/261; 327/264
(58) Field of Classification Search ........ 327/261–264, 327/392–395; 326/82–83, 85–88
See application file for complete search history.

(56) References Cited

U.S. PATENT DOCUMENTS

| 4,862,015 A | 8/1989 | Grandfield | 327/538 |
|---|---|---|---|
| 4,897,559 A | 1/1990 | Yun-Ho | 327/263 |
| 5,180,966 A * | 1/1993 | Sugawara et al. | 323/303 |
| 5,226,012 A | 7/1993 | Anano | 365/189.05 |
| 5,453,709 A | 9/1995 | Tanimoto | 327/276 |
| 5,490,074 A | 2/1996 | Argawal | 716/16 |
| 5,600,273 A | 2/1997 | Hall | 327/261 |
| 5,748,019 A * | 5/1998 | Wong et al. | 327/170 |
| 5,748,542 A | 5/1998 | Zheng | 365/194 |
| 5,861,765 A | 1/1999 | Hirai | 327/261 |
| 5,881,005 A | 3/1999 | Otori | 365/205 |
| 5,917,357 A | 6/1999 | Kwon | 327/262 |
| 5,917,762 A | 6/1999 | Zheng | 365/194 |
| 5,929,654 A * | 7/1999 | Park et al. | 326/58 |
| 5,955,907 A | 9/1999 | Niijima | 327/262 |
| 6,044,027 A | 3/2000 | Zheng | 365/194 |
| 6,310,503 B1 | 10/2001 | Kim | 327/261 |
| 6,381,069 B1 | 4/2002 | Riant | 359/569 |
| 6,426,661 B1 | 7/2002 | Curran | 327/263 |
| 6,741,141 B2 | 5/2004 | Kormanyos | 333/81 A |

* cited by examiner

*Primary Examiner*—Linh My Nguyen
(74) *Attorney, Agent, or Firm*—Thompson & Knight LLP; James J. Murphy (57) ABSTRACT

A circuit for generating stable signal edges includes an output driver circuit having a current path for varying a charge on a capacitor in response to an input signal and constant current generation circuitry for maintaining a constant current through the current path of the output driver circuit and varying the charge on the capacitor to produce an output signal with a stable edge.

20 Claims, 6 Drawing Sheets

CONSTANT EDGE GENERATION CIRCUITS AND METHODS AND SYSTEMS USING THE SAME

BACKGROUND OF THE INVENTION

Field of Invention

The present invention relates in general to integrated circuits, and in particular to constant edge generation circuits and methods and systems using the same.

Signal delay circuits, and similar circuits that generate output signal edges having a certain controlled relationship to the corresponding input signal edges, have numerous applications in digital, analog, and mixed analog-digital circuits. For example, in switched-capacitor digital to analog converters (DACs), delay circuits are often utilized to generate the clock signals that time the transfer of charge between circuit nodes. Other exemplary applications include analog to digital converters (ADCs).

In high-speed circuits, the timing relationship between a given input signal and the corresponding delayed output signal must remain relatively constant across a range of process, temperature, and supply voltage variations to insure proper circuit operation. For example, some typical high-speed switched-capacitor DACs sample charge from an input signal onto a sampling capacitor during rough and fine sampling phases and then transfer the sampled charge from the sampling capacitor to an integration capacitor during a subsequent integration phase. Clock signals timing the rough and fine sub-phases are often generated using delay circuits. The clock signals controlling the rough and fine sub-phases must be well controlled in phase to ensure proper charge transfer between the switched-capacitor circuit nodes. However, the amount of delay introduced by conventional delay circuits often unacceptably varies with such factors as supply voltage, device temperature, and/or device fabrication process making it difficult to maintain proper signal phase relationships.

As the demand for higher speed digital, analog, and mixed analog-digital circuits increases, the need for signal edge generation techniques which produce signal edges which have a stable-delay across any combination of variation in supply voltage, temperature, and process variation correspondingly increases. One particularly advantageous application of such techniques should be in delay and similar circuits. Furthermore, these techniques should not significantly increase circuitry complexity, and, in the case of integrated circuit applications, not significantly increase the required amount of chip area.

SUMMARY OF INVENTION

Advantageously, the principles of the present invention provide techniques for generating stable-delay rising and/or falling signal edges, such as for utilization in delay circuitry and the like. In one particular embodiment, a circuit for generating sable-delay signal edges includes an output driver circuit having a current path for varying a charge on a capacitor in response to an input signal and constant current generation circuitry for maintaining a constant current through the current path of the output driver circuit and varying the charge on the capacitor to produce an output signal with a stable-delay edge.

The present inventive principles are particularly useful in a wide range of circuits and systems, which require the generation of output signal edges which are stable with respect to variations in fabrication process, temperature, and/or supply voltage. Exemplary applications include the delay circuits used in high speed switched-capacitor circuits to generate the timing signals which transfer charge between nodes.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings, in which like numbers designate like parts.

Figure 1:
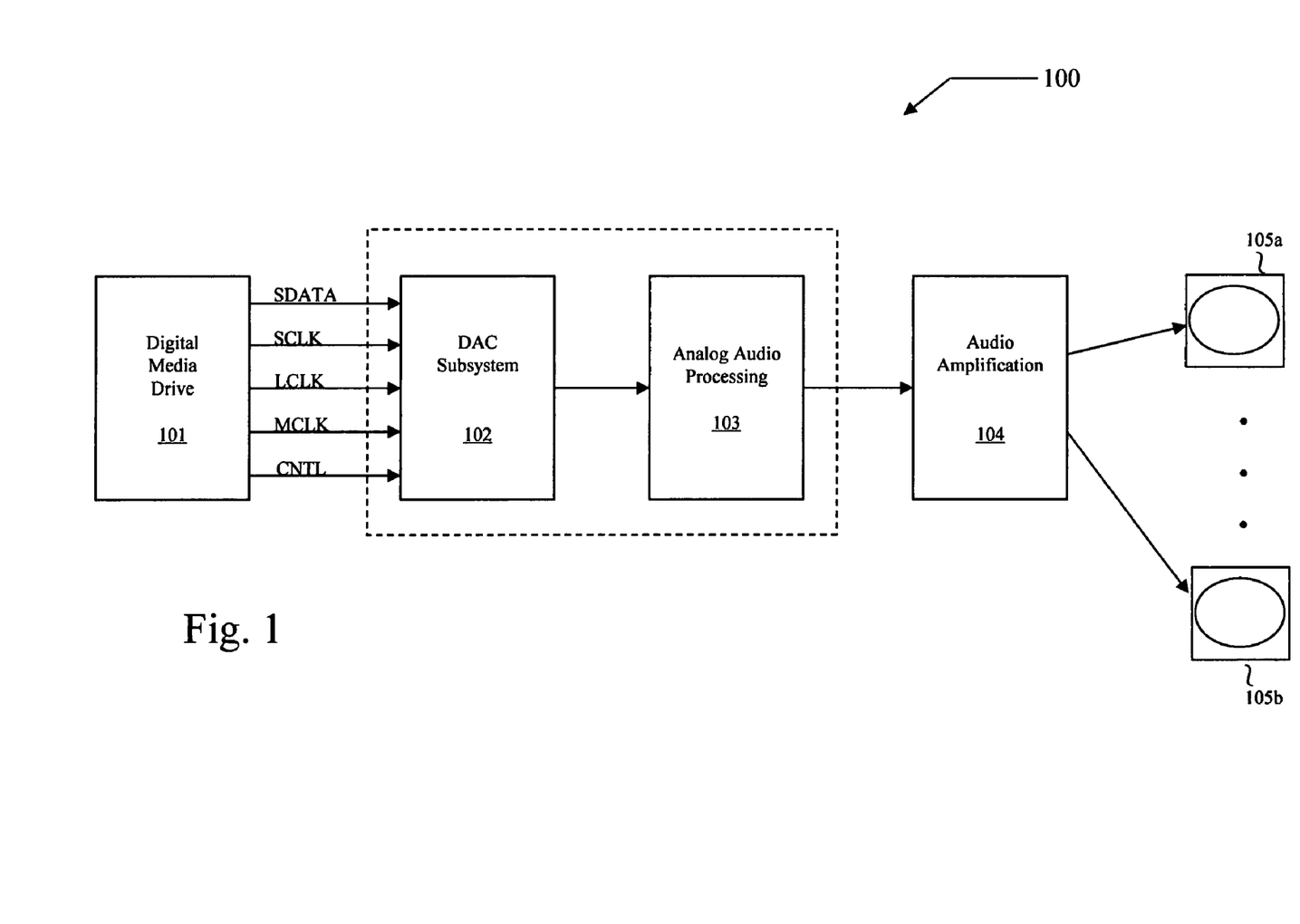
FIG. 1 is a block diagram of an audio system demonstrating one typical system application of the principles of the present invention.

FIG. 1 is a high-level block diagram of an audio system 100 suitable for describing a typical system application of the principles of the present invention. Audio system 100 includes a digital media drive 101, such as a compact disk (CD) or digital versatile disk (DVD) player. Digital media drive 101 provides at least one serial digital audio data stream (SDATA) to a digital to analog converter (DAC) subsystem 102, along with associated clock and control signals. The clock signals include a master clock (MCLK) signal, which is utilized by the digital filters and delta-sigma modulators within DAC subsystem 102. A serial clock (SCLK) signal times the transfer of serial audio data SDATA between digital media drive 101 and DAC subsystem 102. Finally, a left-right clock (LRCK) signal, typically having a frequency corresponding to the audio sample rate, determines whether left or right channel data are currently being transmitted on the SDATA path. Control signals (CNTL) support operations such as system reset and filter de-emphasis control.

After conversion by DAC subsystem 102, the analog audio signals undergo further processing, such as analog filtering, within analog audio processing block 103. The resulting processed audio signals are amplified by audio amplification block 104, which ultimately drives a set of speakers, such as speakers 105a and 105b, which are shown for illustration.

Figure 2:
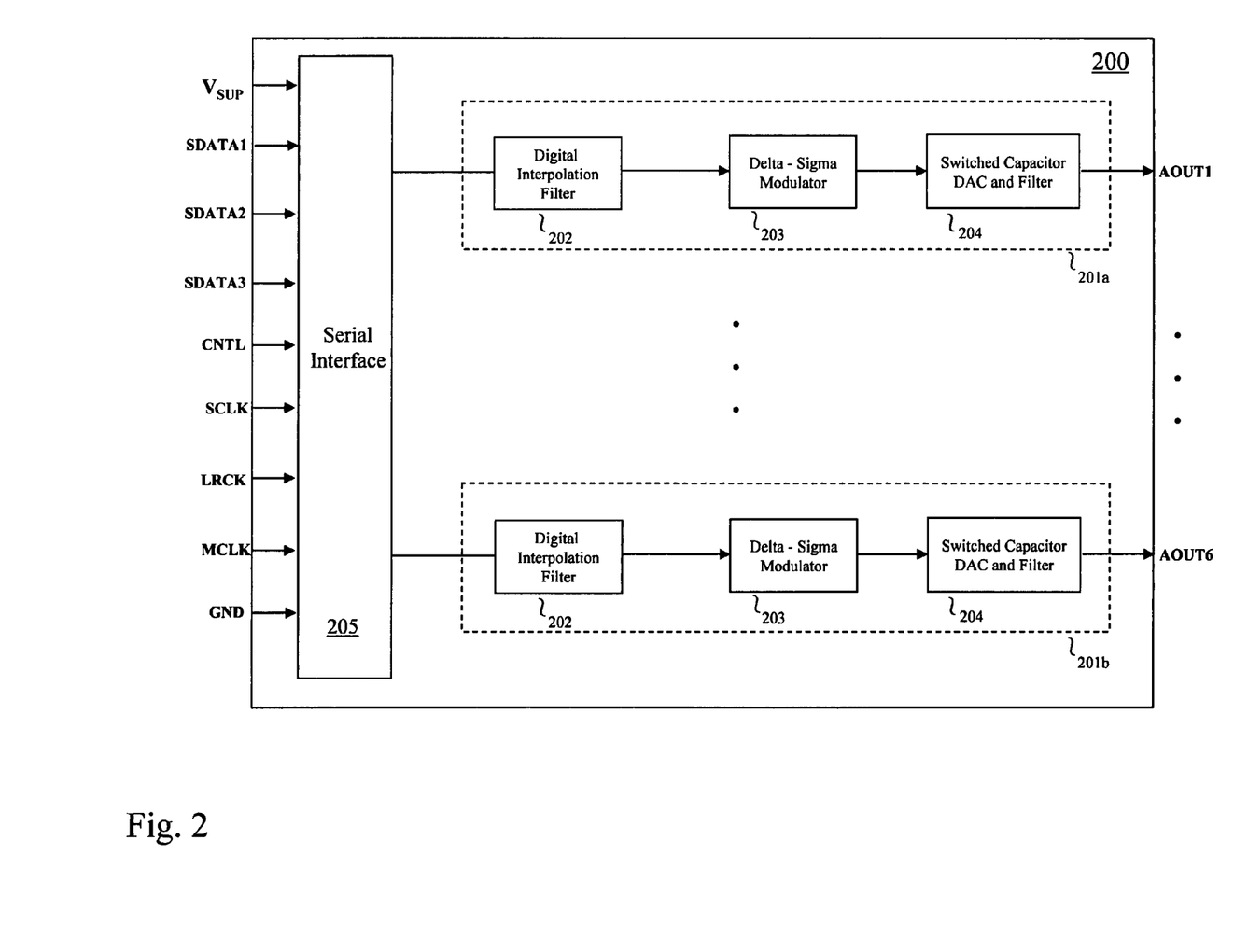
FIG. 2 is a block diagram of a representative multiple-channel digital to analog converter (DAC) embodying the principles of the present invention and suitable for utilization in the DAC subsystem of FIG. 1.

FIG. 2 is a block diagram of a single-chip multiple-channel digital to analog converter (DAC) 200, suitable, in one application, for utilization in DAC subsystem 102 of FIG. 1. In the illustrated embodiment, DAC 200 includes six (6) conversion paths 201 for processing up to six (6) channels of audio data having outputs AOUT–AOUT6. Two representative conversion paths 201a and 201b are shown in FIG. 2 for illustrative purposes. DAC 200 can receive up to three streams of two-channel digital audio data SDATA1–SDATA3, and output up to six (6) channels of analog audio AOUT1–AOUT6.

Each data path 201a–201b includes a digital interpolation filter 202, a delta-sigma modulator 203, and a switched-capacitor DAC and filter 204. Serial interface circuitry 205 includes terminals or pins for receiving three stereo digital input data streams SDATA1–SDATA3, along with the MCLK, SCLK, and LRCK clock signals described above. DAC 200 also includes one or more power supply pins or terminals $V_{SUP}$ and one or more ground pins or terminals GND.

Figure 3A:
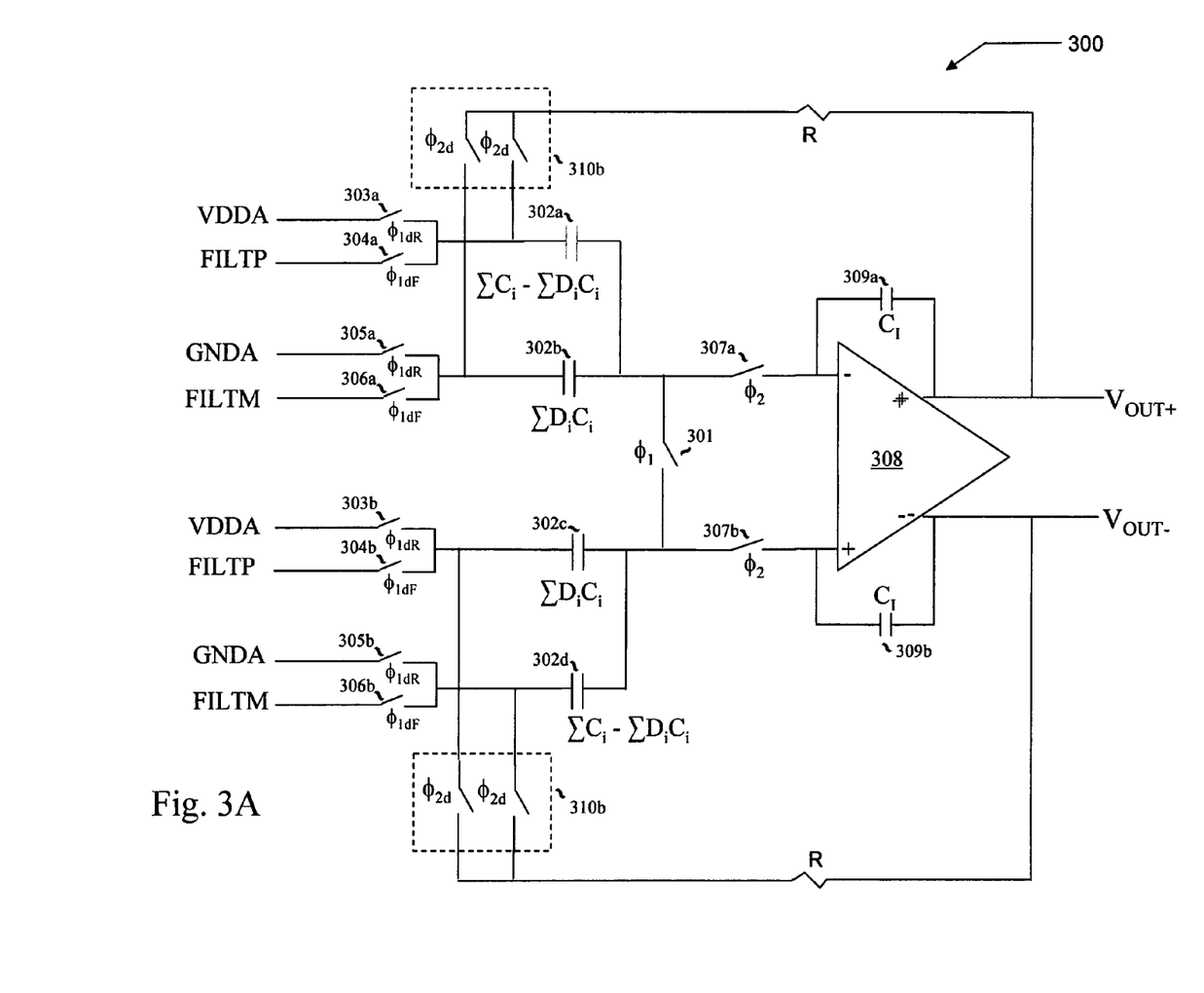
FIGS. 3A and 3B are respectively an electrical schematic diagram of a switched-capacitor DAC suitable for utilization in the switched capacitor DAC-filter blocks shown in FIG. 2 and a corresponding timing diagram illustrating exemplary operations of the switched-capacitor DAC shown in FIG. 3A.

FIG. 3A is a simplified diagram illustrating the effective operation of a typical switch-capacitor DAC 300 in response to i number of data bits $D_i$. Specifically, FIG. 3A shows the switching circuitry, which samples the unfiltered reference voltages VODA and GNDA and the filtered reference voltages FILTP and FILTM onto corresponding capacitors $C_i$. For simplicity, the switches controlled by the data bits $D_i$ have not been shown; however, generally, each data bit $D_i$ determines to which reference voltages the corresponding capacitor $C_i$ is coupled. For example, for capacitors 302a–302b, if a bit $D_i$ is in a logic zero (0) state, the corresponding capacitor $C_i$ is coupled to the reference voltage VODA during rough phase $\Psi_{1dR}$ and to the reference voltage FILTP during fine sub-phase $\Psi_{1dF}$, discussed further below. On the other hand, if a bit $D_i$ is in a logic one (1) state, the corresponding capacitor $C_i$ is coupled to the reference voltage GNDA during rough phase $\Psi_{1dR}$ and to the reference voltage FILTM during fine sub-phase $\Psi_{1dF}$. Similarly, for capacitors 302c and 302d, if a bit $D_i$ is in a logic one (1) state, the corresponding capacitor Ci is coupled to the reference voltage VODA during the rough sub-phase $\Psi_{1dR}$ and to the reference voltage FILTP during the fine sub-phase $\Psi_{1dF}$. On the other hand, if a bit $D_i$ is in a logic zero (0) state, the corresponding capacitor $C_i$ is coupled to the reference voltage GND during the rough sub-phase $\Psi_{1dR}$ and to the reference voltage FILTM during the fine sub-phase $\Psi_{1dF}$.

Figure 3B:
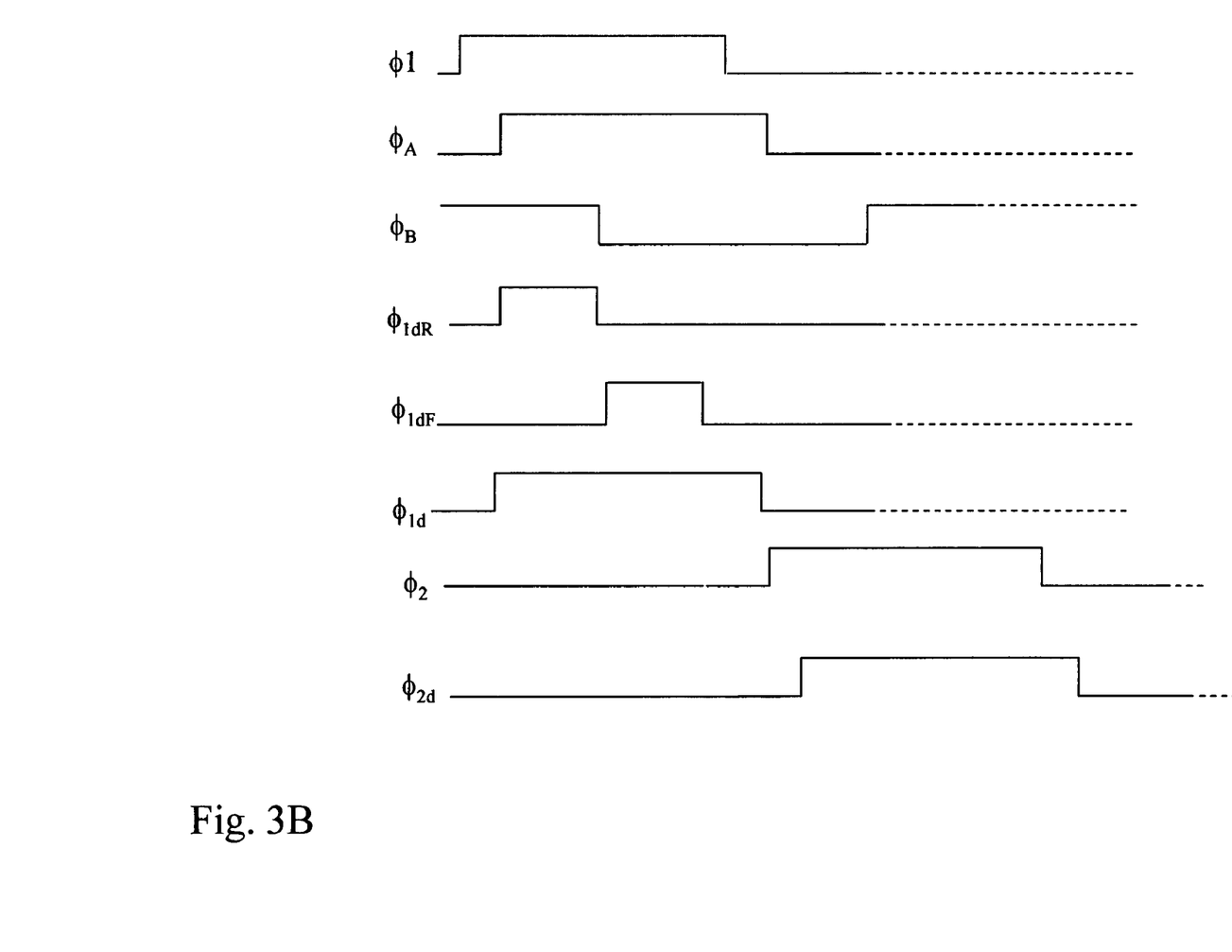
Figure 3C:
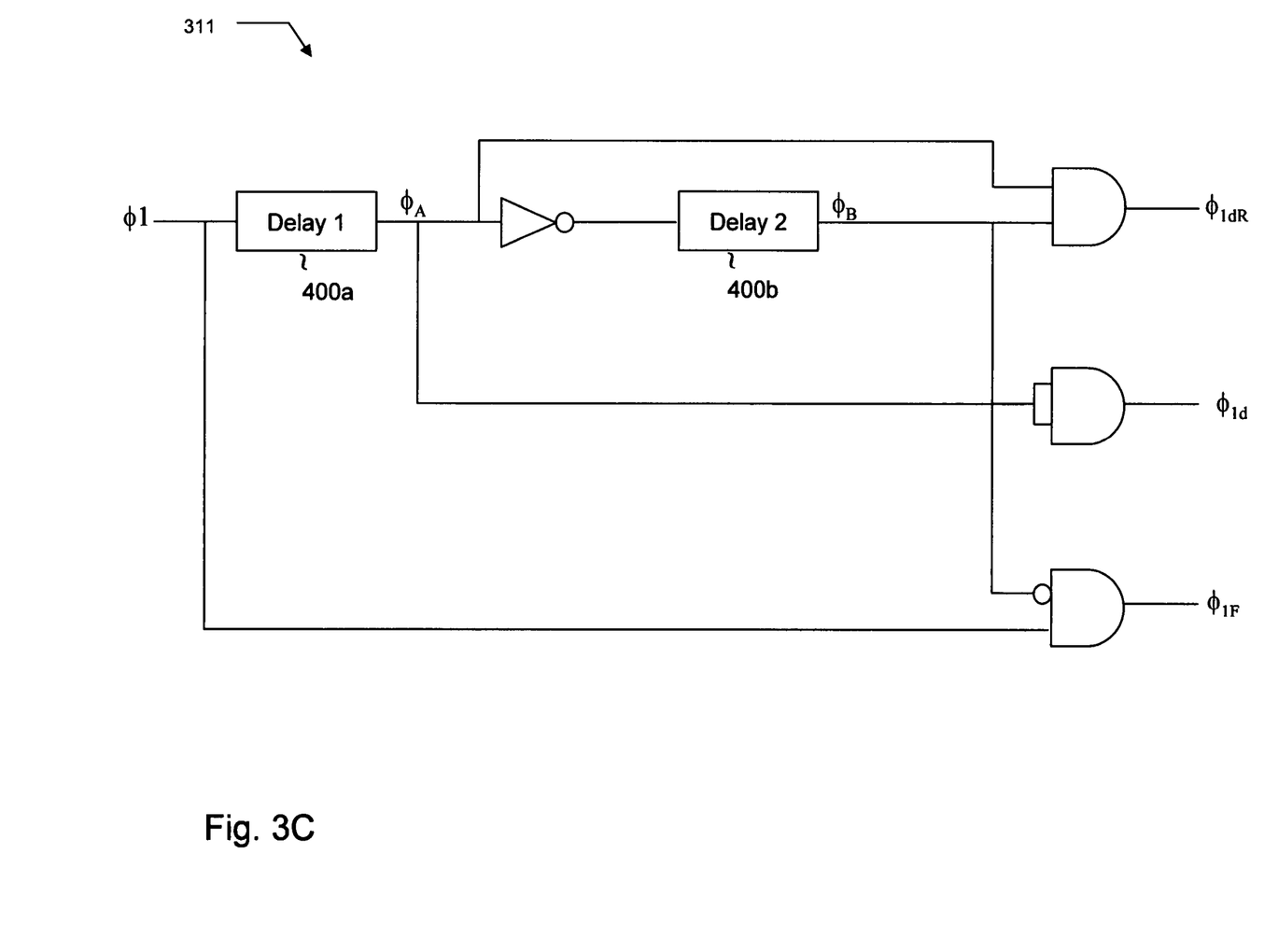
FIG. 3C is a logic diagram of a representative circuit suitable for generating the signals shown in FIGS. 3A and 3B.

As shown in the timing diagram of FIG. 3B, switched-capacitor DAC 300 operates in four primary phases, namely, Phase 1 ($\Psi_1$), Phase 1 delayed, ($\Psi_{1d}$) Phase 2 ($\Psi_2$), and Phase 2 delayed ($\Psi_{2d}$). Phase $_{1d}$ includes a rough sub-phase $\Psi_{1dR}$ and a fine sub-phase $\Psi_{1dF}$. FIG. 3C is a logic diagram illustrating signal generation circuitry 311 suitable for generating the signals shown in FIG. 3B. Signal generation circuitry 311 is based on a pair of delay cells 400a and 400b, which embody the principles of the present invention described below in conjunction with FIG. 4.

During phase $\Psi_1$, switch 301 closes and couples the top plates of sampling capacitors ($C_i$) 302a–302d together. Then, as an example, during the rough sub-phase $\Psi_{1dR}$, switches 303a–303b and 305a–305b close to initiate the charging of sampling capacitors 302a and 302c from unfiltered reference voltage VDDA and capacitors 302b and 302d from unfiltered reference voltages GNDA. During fine sub-phase $\Psi_{1dF}$, switches 304a–304b and 306a–306b close to complete the charging of capacitors 302a and 302c from the filtered reference voltage FILTP and capacitors 302b and 302d from the filtered reference voltage FILTM.

Switches 307a and 307b close during phase $\Psi_2$ and during the subsequent delay phase $\Psi_{2d}$, the charges on sampling capacitors 302a–302b and 302c–302d transfer to the inverting and non-inverting inputs of operational amplifier 308 and integration capacitors ($C_i$) 309a and 309b. Operational amplifier 308 generates the differential outputs $V_{OUT+}$ and $V_{OUT-}$.

Figure 4:
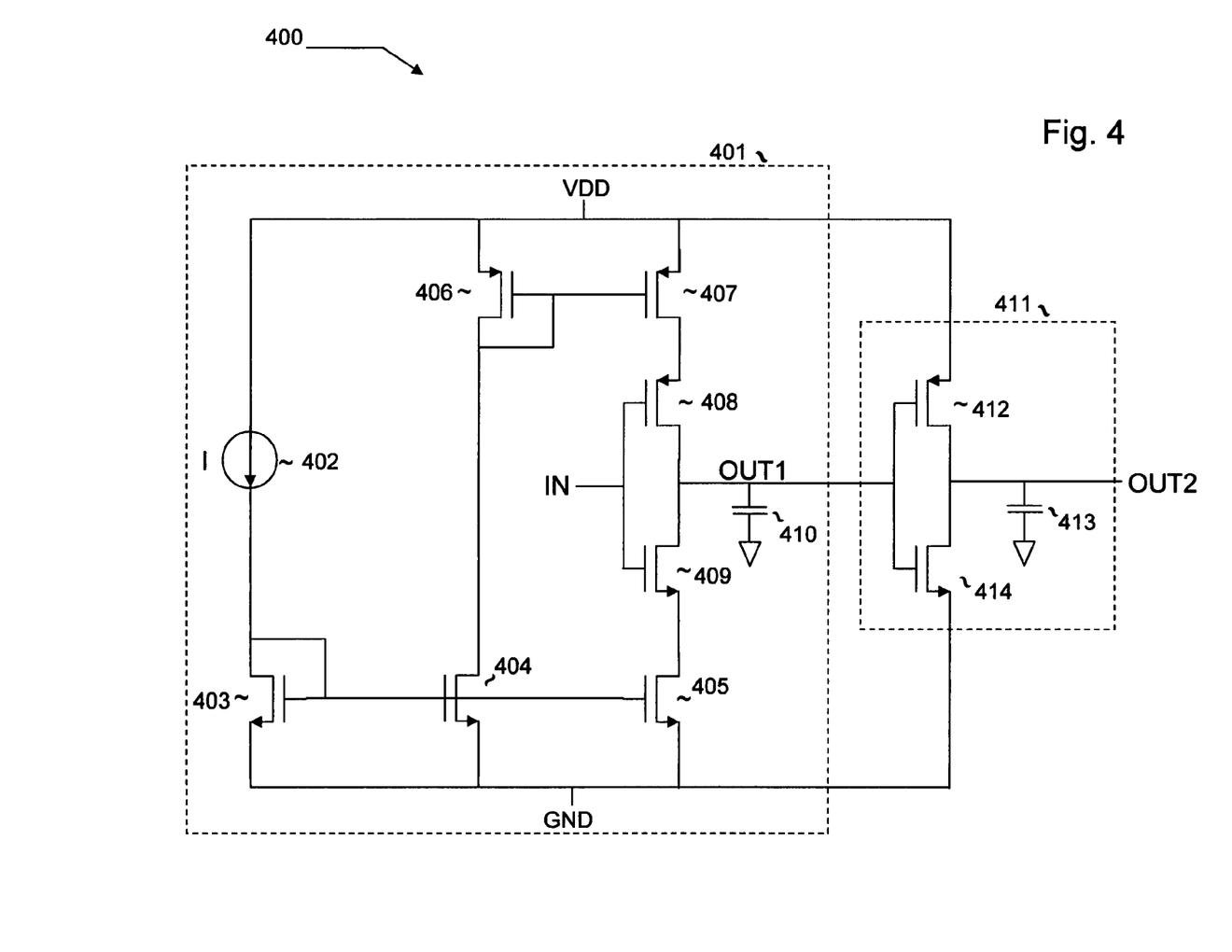
FIG. 4 is an electrical schematic diagram of a representative signal delay cell embodying the principles of the present invention.

FIG. 4 is an electrical schematic diagram of a delay circuit 400 embodying the principles of the present invention. One particular representative application of delay circuit 400 is in clock generation circuitry 311 discussed above in conjunction with the switched-capacitor DAC 300 of FIG. 3C, although there are numerous other applications for these principles in both discrete and integrated circuitry.

Delay circuit 400 includes a first delay stage 401 based on a constant current source 402. Constant current source 402, which is preferably of a temperature and voltage invariant design, provides a constant base current to an n-type metal oxide semiconductor (NMOS) mirror transistor 403, which mirrors a multiple of the constant base current through the source-drain current paths of NMOS transistors 404 and 405.

NMOS transistor 404, in turn, controls the current flowing through the source-drain current path of p-type semiconductor metal oxide semiconductor (PMOS) current minor transistor 406. A multiple of the constant current flowing through PMOS current mirror transistor 406 is mirrored through the source-drain current path of a second PMOS transistor 407. PMOS transistor 407 sources the output node OUT1 through PMOS driver transistor 408 in response to a logic low voltage level of the input signal IN and charges capacitor 410. By charging capacitor 410 with a constant current, rising signal edges are generated at output node OUT1, which have a rise time which has a stable delay in view of both changes in temperature and fabrication process.

During logic high voltage levels of the input signal IN, a constant current is sunk through NMOS transistors 405 and 409 from the output node OUT1 to discharge capacitor 410. Consequently, the falling edges generated at output node OUT1 are constant in fall time with changes in temperature and fabrication process.

The stable-delay rising and falling edges generated at output node OUT1 are controlled by the amount of current being sourced and sunk during charging and discharging of capacitor 410. These currents may be varied in at least two ways in the design of delay cell 400. First, the base current generated by constant current source 402 may be varied. Second, the current multiplications provided by the current mirrors formed by NMOS transistors 403 and 404, NMOS transistors 403 and 405, and/or PMOS transistors 406 and 407 may be varied, individually or in combination, which set the constant currents being sourced and sunk at capacitor 410.

The delay at node OUT1, however, may vary with changes in supply voltage, since the current mirrors formed by transistor pairs 403 and 404, 403 and 405, 406 and 407, operated directly from the high and low voltage rails. For example, if the supply voltage $V_{DD}$ drifts lower, the delay introduced at the output node OUT1 decreases. Specifically, when the supply voltage $V_{DD}$ decreases, the constant current flowing at capacitor 410 must only charge and discharge capacitor 410 with a reduced voltage swing. As a result, the delay introduced at output node OUT1 decreases. Similarly, when the supply voltage $V_{DD}$ increases, the delay introduced at the output node OUT1 increases, since the constant current flowing at capacitor 410 must now charge capacitor 410 with a greater voltage swing.

According to the principles of the present invention, a second delay circuit 411 is provided at the output node OUT1 to compensate for delay variations caused by changes in the supply voltage $V_{DD}$. Second delay circuit 411 includes a PMOS transistor 412 that charges a capacitor 413 directly from the $V_{DD}$ supply rail in response to logic low voltage levels output generated at output node OUT1 by delay circuit 401. An NMOS transistor 414 discharges capacitor 413 directly to the low voltage rail (GND), in response to logic high voltage levels output at output node OUT1 by delay circuit 401.

When the supply voltage level $V_{DD}$ decreases, the time to charge capacitor increased, thereby increasing the delay at second output node OUT2. By sizing capacitor 413 relative to the size of capacitor 410, the resulting increased delay introduced by second delay circuit 410 compensates the decreased delay introduced by delay circuit 401. Similarly, when the supply voltage $V_{DD}$ increases, capacitor 413 charges more rapidly, thereby introducing less delay between output node OUT1 output node OUT2, thereby compensating for any corresponding increased delay at output node OUT1 of delay circuit 401.

In alternate embodiments, the high and/or low logic levels of the output signal generated at ultimate node OUT2 may be varied by varying the relationship between the currents sourced and sunk at output node OUT1. Specifically, if the constant current through PMOS driver transistor 408 is substantially equal to the constant current through NMOS driver transistor 409, then the ouptut signal at output node OUT2 will be symmetrical to the input signal IN, since the delay introduced at both the rising and falling edges of the input signal IN is equal. However, for example, if the constant current sunk through NMOS drive transistors 409 is set, as described above, to be greater than the current sourced through PMOS transistor 408, then the logic high logic pulse widths at output node OUT2 are lengthened. Similarly, if the constant current sourced through PMOS transistor 408 is greater than the constant current sunk through NMOS transistor 409, then the logic low pulse widths at output node OUT2 are lengthened.

Although the invention has been described with reference to specific embodiments, these descriptions are not meant to be construed in a limiting sense0. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A circuit for generating stable signal edges comprising:
   an output driver circuit including a current path switchably coupled to a selected plate of a capacitor for applying a current directly to the selected plate to vary a charge on the capacitor in response to an input signal;
   constant current generation circuitry for maintaining a constant current through the current path of the output driver circuit and varying the charge on the capacitor to produce an output signal with a stable edge; and
   another driver circuit coupled to the capacitor for varying a charge on a second capacitor and operating from a voltage rail in response to the output signal from the output driver for compensating for variations in the output signal edge caused by supply voltage variations.

2. The circuit of claim 1, wherein the constant current generation circuitry comprises:
   a constant current source for generating a constant base current; and
   a constant mirror for mirroring a multiple of the constant base current generated by the constant current source to the current path of the output driven circuit.

3. The circuit of claim 1, wherein the constant current generation circuitry comprises:
   a constant current source generating a first constant current;
   a first current mirror for mirroring a multiple of the first constant current generated by the current source; and
   a second current mirror for mirroring a multiple of the first constant current generated by the first current mirror to the current path of the output driver.

4. The circuit of claim 2, wherein the output driver comprises a transistor for discharging the capacitor in response to the input signal to generate a stable falling edge of the output signal.

5. The circuit of claim 2, wherein the output driver comprises a transistor for charging the capacitor in response to the input signal to generate a stable rising edge of the output signal.

6. The circuit of claim 4, wherein the transistor comprises an n-type metal oxide semiconductor (NMOS) transistor for discharging the capacitor, and further comprising:
   an NMOS current mirror for mirroring the multiple of the constant current through the current path of the NMOS transistor.

7. The circuit of claim 5, wherein the transistor comprises a p-type metal oxide semiconductor (PMOS) transistor for charging the capacitor, and further comprising:
   a PMOS current mirror for mirroring the multiple of the constant current through the current path of the PMOS transistor.

8. A method of providing a stable signal edge comprising:
   generating a constant current with a constant current source;
   selectively varying a charge on a capacitor with a driver circuit coupled to the capacitor and having a current path selectively passing the constant current directly to a plate of the capacitor in response to an input signal to generate an output signal with a stable edge; and
   varying a charge on a second capacitor coupled to the capacitor with a second driver operating from a voltage rail for compensating for delay variations in the output signal caused by supply voltage variations.

9. The method of claim 8, wherein varying a charge on a capacitor comprises charging the capacitor by sourcing current through the current path of the driver to generate a stable rising edge of the output signal.

10. The method of claim 8, wherein varying a charge on a capacitor comprises discharging the capacitor by sinking current through the current path of the driver to generate a stable falling edge of the output signal.

11. The method of claim 8 wherein generating a constant current comprises mirroring a multiple of a constant current generated by a constant current source to the current path of the driver.

12. The method of claim 11, wherein mirroring a multiple of the constant current comprises:
   mirroring a multiple of the constant current generated by the constant current source with a first current mirror; and mirroring a multiple of the constant current mirrored by the first current mirror to the current path of a driver with a second current mirror.

13. The method of claim 8, further comprising varying the constant current generated by the constant current source to vary the time rate of variation of the charge on the capacitor.

14. The method of claim 11, further comprising varying the mirroring of the constant current to vary the time rate of variation of the charge on the capacitor.

15. A delay circuit comprising:
   a capacitor;
   a constant current source for generating a constant base current;
   a first driver transistor for charging the capacitor by directly sourcing a first constant current to a plate of the capacitor in response to a first logic level of an input signal to generate a rising edge of an output signal;
   a first current mirror for sourcing the first constant current from a high voltage rail proportional to the constant base current to the first transistor;
   a second driver transistor for discharging the capacitor by directly sinking a second constant current from the plate of the capacitor in response to a second logic level of the input signal to generate a falling edge of the output signal;
   a second current mirror for sinking the second constant current to a low voltage rail proportional to the constant base current through the second transistor; and
   a second delay cell for compensating for delay variations caused by changes in voltage between the high and low supply rails.

16. The delay circuit of claim 15, wherein the first and second current mirrors provide first and second constant currents which are substantially equal such that the input and output signals are substantially symmetrical.

17. The delay circuit of claim 15, wherein the first and second current mirrors provide unequal first and second constant currents and a width of a pulse of the output signal proportionally differs in width from a corresponding pulse of the input 18. The delay circuit of claim 15, wherein the second delay cell comprises:
   a second capacitor;
   a first driver transistor for charging the second capacitor from the high voltage rail in response to a first logic level of the output signal from a first delay cell; and
   a second driver transistor for discharging the second capacitor to the low voltage rail in response to a second logic level of the signal output from the first delay cell.

19. The delay circuit of claim 15, wherein the input signal comprises a control signal for a switched-capacitor circuit.

20. The delay circuit of claim 15, wherein the input signal comprises a control signal in an audio integrated circuit.

* * * * *